United States Patent
Fujita et al.

(10) Patent No.: US 6,225,779 B1
(45) Date of Patent: May 1, 2001

(54) POWER SUPPLY MONITORING INTEGRATED CIRCUIT DEVICE FOR INDIVIDUALLY MONITORING VOLTAGES OF CELLS

(75) Inventors: Hiroyuki Fujita; Koichi Inoue, both of Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 09/341,129

(22) PCT Filed: Jan. 9, 1998

(86) PCT No.: PCT/JP98/00074
§ 371 Date: Aug. 26, 1999
§ 102(e) Date: Aug. 26, 1999

(87) PCT Pub. No.: WO98/31087
PCT Pub. Date: Jul. 16, 1998

(30) Foreign Application Priority Data

Jan. 10, 1997 (JP) .................................... 9-002756

(51) Int. Cl.$^7$ ................................................ H01M 10/46
(52) U.S. Cl. ............................................................ 320/116
(58) Field of Search ................................... 320/116, 118, 320/119, 120, 122, FOR 114, FOR 116, FOR 117

(56) References Cited

U.S. PATENT DOCUMENTS

| | | |
|---|---|---|
| 4,622,508 | 11/1986 | Matteau et al. . |
| 5,206,578 | 4/1993 | Nor . |
| 5,578,914 | 11/1996 | Morita . |

FOREIGN PATENT DOCUMENTS

| | | |
|---|---|---|
| 0 599 629 | 6/1994 | (EP) . |
| 0 691 725 | 1/1996 | (EP) . |
| 0 693 814 | 1/1996 | (EP) . |
| 7-147734 | 6/1995 | (JP) . |
| 7-336905 | 12/1995 | (JP) . |
| 8-23637 | 1/1996 | (JP) . |
| 8-191547 | 7/1996 | (JP) . |
| 9-140067 | 5/1997 | (JP) . |

*Primary Examiner*—Edward H. Tso
(74) *Attorney, Agent, or Firm*—Arent Fox Kintner Plotkin & Kahn, PLLC

(57) ABSTRACT

A power supply monitoring integrated circuit device for individually detecting the voltages of a plurality of lithium-ion cells connected in series has a plurality of comparators for comparing the voltages obtained by dividing the voltages of the individual cells with a predetermined voltage. The power supply monitoring integrated circuit device also has terminals for feeding electric power from the individual cells through resistors to the inputs of the individual comparators and terminals for supplying electric power from the individual cells to the individual comparators, and, in accordance with the results of comparison by the individual comparators, controls charging or discharging of the cells.

6 Claims, 3 Drawing Sheets

POWER SUPPLY MONITORING INTEGRATED CIRCUIT DEVICE FOR INDIVIDUALLY MONITORING VOLTAGES OF CELLS

TECHNICAL FIELD

The present invention relates to an integrated circuit device for monitoring power supply (hereafter a "power supply monitoring IC") that is used to prevent a lithium-ion cell or the like from being brought into an overdischarged or overcharged state.

BACKGROUND ART

A conventional power supply monitoring IC will be described below with reference to FIG. 3. In FIG. 3, reference numeral 72 represents a power supply apparatus (hereafter a "battery pack") having lithium-ion cells 2 and 3 and a power supply monitoring IC 73. When the cells 2 and 3 are charged, terminals 11 and 12 are connected to a power source for charging (not shown), and, when the battery pack 72 is in use, a load (not shown) is connected to the terminals 11 and 12.

In normal use, the lithium-ion cells 2 and 3 each have a voltage from 2.3 V to 4.2 V. Accordingly, for example, the power supply monitoring IC 73, when the voltage becomes higher than 4.3 V, inhibits charging to prevent overcharging, and, when the voltage becomes lower than 2.2 V, inhibits discharging to prevent overdischarging.

Now, the portion of this conventional power supply monitoring IC 73 that detects overdischarging will be described. The portion that detects overcharging will not be described; nor is it shown in FIG. 3. Of the two lithium-ion cells 2 and 3, the cell 2 is placed on the higher potential side. The higher potential end of the cell 2 is connected to the positive terminal 11 of the battery pack 72. On the other hand, the lower potential end of the cell 3 is connected to the drain of an n-channel MOSFET (metal-oxide semiconductor field-effect transistor) 8. The source of the MOSFET 8 is connected to the negative terminal 12. The gate of the MOSFET 8 is connected to a terminal T1 of the power supply monitoring IC 73, so that the MOSFET 8 is turned on and off by the power supply monitoring IC 73.

The higher potential end of the cell 2 is connected through a protection resistor R5 to a terminal U1 of the power supply monitoring IC 73. The node between the cells 2 and 3 is connected through a protection resistor R6 to a terminal U2. The lower potential end of the cell 3 is connected to a terminal GND of the power supply monitoring IC 73.

During discharging or charging, the power supply monitoring IC 73 turns on the MOSFET 8 so that electric power is supplied from the cells 2 and 3 to an electronic appliance or the like connected to the terminals 11 and 12. On the other hand, during charging, a direct-current voltage is applied from a direct-current power source or the like to the terminals 11 and 12, and thereby the cells 2 and 3 are charged.

The protection resistors R5 and R6 have a resistance of about 1kΩ and serve to prevent infiltration of noise into the power supply monitoring IC 73 which may result in electrostatic destruction of the power supply monitoring IC 73. Moreover, the protection resistors R5 and R6 also serve to protect the cells 2 and 3 from destruction by preventing the cells 2 and 3 from being short-circuited even when the terminal U1 or U2 is short-circuited to the terminal GND.

Between the terminals U1 and U2, resistors R1 and R2 are connected in series. The voltage at the node between the resistors R1 and R2 is fed to the non-inverting input terminal (+) of a comparator 4. To the inverting input terminal (−) of the comparator 4, a voltage higher than the voltage at the terminal U2 by a reference voltage V1 is fed. The comparator 4 receives electric power via the terminal U1. Thus, the comparator 4 compares the voltage of the cell 2 with a predetermined overdischarge voltage. The overdischarge voltage is set, for example, at 2.2 V. The comparator 4 outputs a low level if the voltage of the cell 2 is lower than the overdischarge voltage, and outputs a high level if the voltage of the cell 2 is higher than the overdischarge voltage.

Between the terminals U2 and GND, resistors R3 and R4 are connected in series. The voltage at the node between the resistors R3 and R4 is fed to the non-inverting input terminal (+) of a comparator 5. The terminal GND is grounded so as to be at the ground level. To the inverting input terminal (−) of the comparator 5, a voltage higher than the ground level by a reference voltage V2 is fed. The resistances of the resistors R1 and R3 are equal, and the resistances of the resistors R2 and R4 are equal. The reference voltages V1 and V2 are equal. Thus, the voltages of the cells 2 and 3 are checked against the same overdischarge voltage.

The outputs of the comparators 4 and 5 are fed to an AND circuit 6. Thus, when the voltages of both of the cells 2 and 3 are higher than the overdischarge voltage, the AND circuit 6 outputs a high level. By contrast, when the voltage of at least one of the cells 2 and 3 is lower than the overdischarge voltage, the AND circuit 6 outputs a low level. In this way, when the voltages of both of the cells 2 and 3 are higher than the overdischarge voltage, the AND circuit 6 outputs a high level that is used as a discharge enable signal SD. The discharge enable signal SD is fed to a discharge control circuit 7.

While the discharge control circuit 7 is receiving the discharge enable signal SD, the discharge control circuit 7 applies a signal to the gate of the MOSFET 8, which is connected to the terminal T1, to turn on the MOSFET 8. By contrast, while the discharge control circuit 7 is not receiving the discharge enable signal SD, it keeps the MOSFET 8 off. As a result, the cells 2 and 3 are disconnected from the load, and thereby discharging is stopped. In this way, the cells 2 and 3 are prevented from being brought into an overdischarged state.

However, in this conventional power supply monitoring IC 73, voltage drops are caused across external impedance, such as the protection resistors R5 and R6 and wiring resistances, by the current flowing therethrough, and this causes an error in the detected voltages of the cells 2 and 3. Thus, variations in the current flowing into the power supply monitoring IC 73 and variations in external impedance degrade detection accuracy. For example, in the case of the comparator 5, which receives electric power through the resistor R6, a variation in the voltage resulting from electric power being supplied appears at the voltage division point, and such a variation appearing at the voltage division point as a result of electric power being supplied is difficult to correct. Now suppose that the power supply monitoring IC 73 monitors the overdischarge voltage with accuracy of about 50 mV, that the current flowing through the resistor R6 via the terminal U2 as the operation current of the comparator 5 is tens of microamperes, and that the resistor R6 has a resistance of 1 kΩ, then a voltage drop of tens of microvolts occurs. In this way, variations in the resistances of the protection resistors, in wiring resistances, and in the operation current cause an error in detection accuracy as large as such a voltage drop, and thereby degrade detection accuracy. Furthermore, the current flowing through the resistors R1 and R2 in the upper stage flows also through the resistors R3 and R4, and this also causes an error in the voltage at the voltage division point with respect to the voltage that should be present there.

Moreover, in case the resistor R6 is disconnected from the terminal U2 by an accidental cause such as improper soldering or a mechanical shock, the resistors R1 to R4 are left connected simply in series, and therefore the comparators 4 and 5 erroneously recognize the average voltage of the cells 2 and 3 as the voltages of the cells 2 and 3, respectively. For example, if such a disconnection occurs at the terminal U2 when the voltage of one of the cells 2 and 3 equals the overdischarge voltage 2.2 V and the voltage of the other equals 3.4 V, the comparators 4 and 5 both recognize the average voltage (2.2+3.4)/2=2.8 V as the voltages of the individual cells 2 and 3 and compare this voltage with the overdischarge voltage 2.2 V. As a result, the AND circuit 6 outputs the discharge enable signal SD to continue discharging, bringing the cells into an overdischarged state.

DISCLOSURE OF THE INVENTION

An object of the present invention is to provide a power supply monitoring IC that offers more secure protection of lithium-ion cells and the like by detecting voltages with higher accuracy and by making correct judgments even when a disconnection occurs at an intermediate terminal like U2.

According to the present invention, a power supply monitoring integrated circuit device for individually monitoring the voltages of a plurality of cells connected in series to control charging or discharging operation of the cells is provided with a plurality of pairs of input terminals provided one pair for each of the cells for receiving the voltages of the cells; a plurality of voltage dividing means for dividing the voltages of the cells received via the input terminals; a plurality of comparators for comparing output voltages of the voltage dividing means with a predetermined voltage; a plurality of electric power input terminals for receiving electric power fed through resistors from higher-potential ends of the cells to operate the comparators; a control means connected to the comparators so as to generate a stop signal for stopping the charging or discharging operation when the voltage of at least one of the cells exceeds the predetermined voltage; and an output terminal connected to the control means for outputting the stop signal.

According to this circuit configuration, while the voltages of the cells connected to the power supply monitoring IC are being monitored, even if a disconnection due to improper soldering occurs at a terminal that is connected to a node between the cells, the power supply monitoring IC, having separate terminals for receiving the voltages of the individual cells, never makes a wrong judgment as does the conventional power supply monitoring IC described earlier. Thus, it is possible to securely protect the cells. Moreover, for every node between the cells, a terminal for feeding a voltage to the corresponding comparator and a terminal for supplying electric power thereto are provided separately, and thereby the current flowing at the terminal for feeding the voltage is reduced accordingly. This makes it possible to reduce voltage drops and thereby increase detection accuracy.

Moreover, by giving a high impedance to such terminals for feeding a voltage, it is possible to greatly reduce the current flowing at those terminals, and thereby reduce the voltage drops across external impedance. This helps reduce the influence of variations in external impedance and in the current and thereby increase detection accuracy.

BEST MODE FOR CARRYING OUT THE INVENTION

<First Embodiment>

Figure 1:
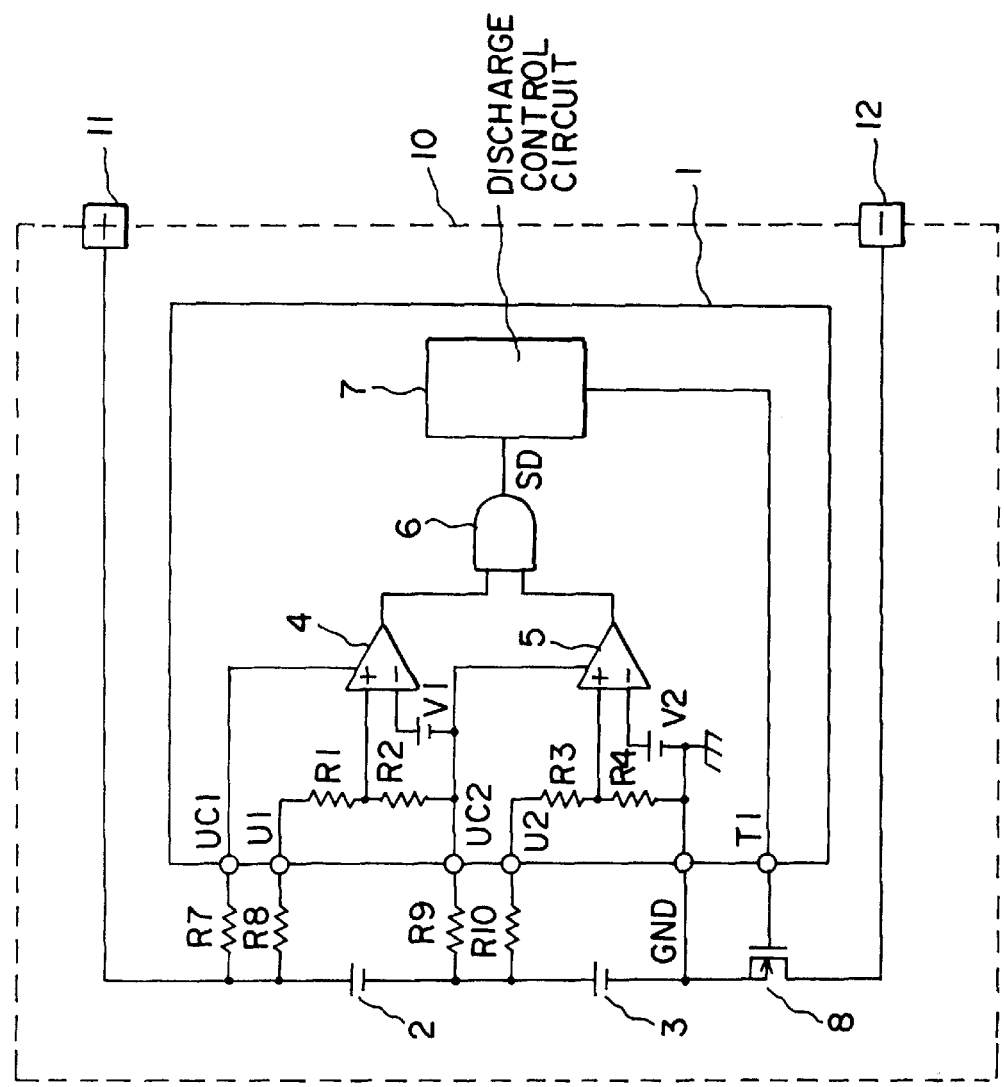
FIG. 1 is a block diagram of the power supply monitoring IC of a first embodiment of the present invention.
Figure 3:
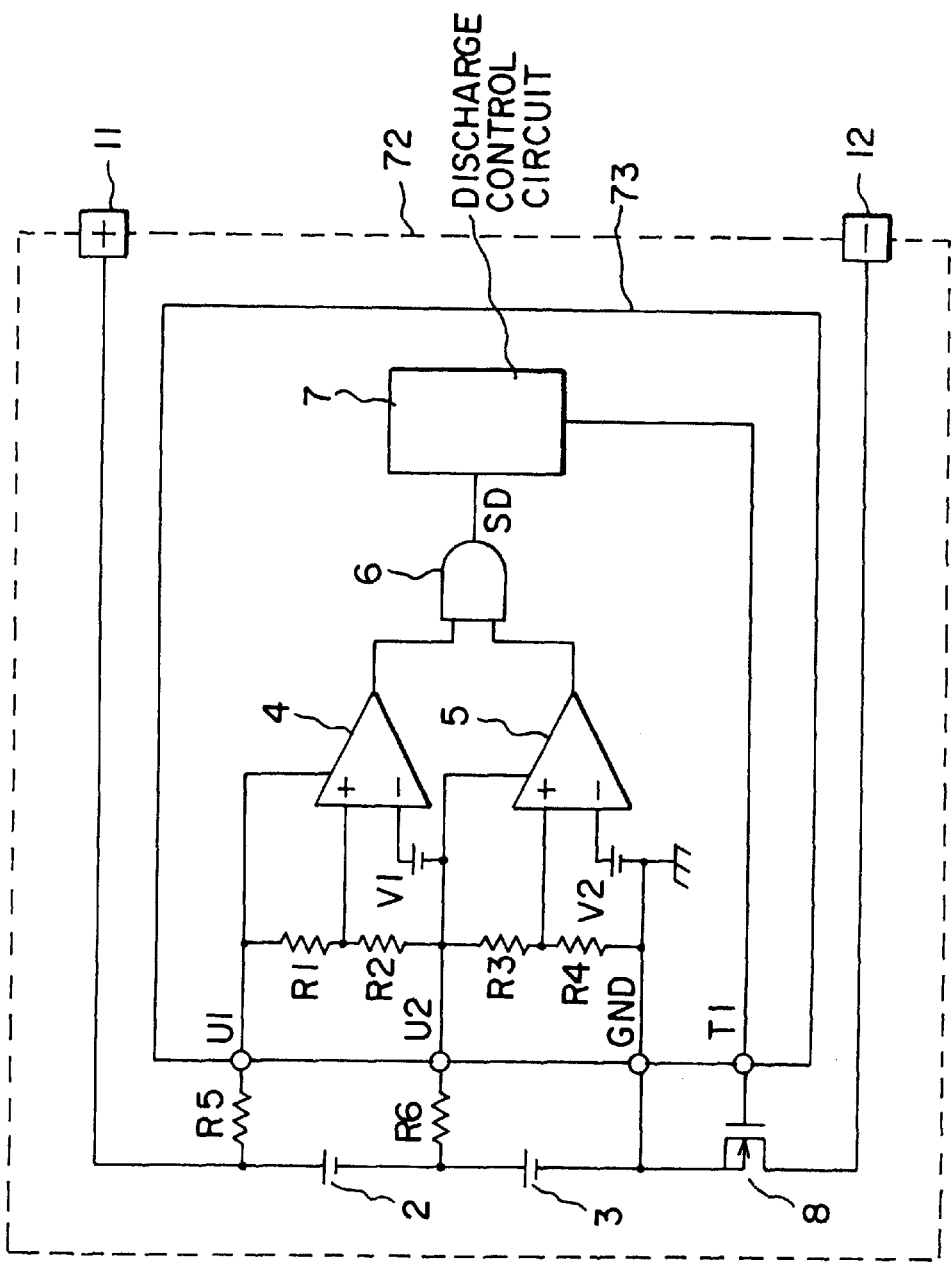
FIG. 3 is a block diagram of a battery pack employing a conventional power supply monitoring IC.

A first embodiment of the present invention will be described with reference to FIG. 1. FIG. 1 is a block diagram of a battery pack 10 employing a power supply monitoring IC 1 that monitors overdischarging of cells 2 and 3. Such elements as are found also in the battery pack 72 employing the conventional power supply monitoring IC 73 (see FIG. 3) described earlier are identified with the same reference numerals and symbols, and overlapping descriptions will not be repeated.

In the power supply monitoring IC 1, an electric power supply terminal UC1 and a voltage detection terminal U1 are provided separately. The electric power supply terminal UC1 is connected through a protection resistor R7 to the higher potential end of the lithium-ion cell 2. The voltage detection terminal U1 is connected through a protection resistor R8 to the higher potential end of the lithium-ion cell 2. The higher potential end of the cell 2 is connected to a positive terminal 11.

Similarly, as an intermediate terminal, an electric power supply terminal UC2 and a voltage detection terininal U2 are provided separately. The electric power supply terminal UC2 is connected through a protection resistor R9 to the node between the lithium-ion cells 2 and 3. The voltage detection terminal U2 is connected through a protection resistor R10 to the node between the lithium-ion cells 2 and 3. Note that an intermediate terminal refers to a terminal that is connected to a node between cells, like UC2 and U2 connected to the node between the cells 2 and 3. The lower potential end of the cells 2 and 3 is connected to the drain of a MOSFET 8 and to a terminal GND of the power supply monitoring IC 1. The terminal GND is grounded so as to be at the ground level. The source of the MOSFET 8 is connected to a negative terminal 12.

The protection resistors R7 to R10 have a resistance of, for example, about 1 kΩ. Between the terminals U1 and UC2, resistors R1 and R2 are connected in series. For example, the resistor R1 has a resistance of 3 kΩ, and the resistor R2 as a resistance of 1 kΩ.

The voltage at the node between the resistors R1 and R2 is fed to the non-inverting input terminal (+) of a comparator 4. To the inverting input terminal (−) of the comparator 4, a voltage higher than the voltage at the terminal UC2 by a reference voltage V1 is fed. The comparator 4 receives electric power via the terminal UC1. The comparator 4 compares the voltage of the cell 2 with a predetermined overdischarge voltage that is applied to its inverting input terminal (−). Thus, the comparator 4 outputs a low level when the voltage of the cell 2 is lower than the overdischarge voltage, and outputs a high level when the voltage of the cell 2 is higher than the overdischarge voltage.

The current that flows from the electric power supply terminal UC1 into the comparator 4 is tens of microamperes. The current that flows from the voltage detection terminal U1 into the resistors R1 and R2 is as small as several microamperes owing to a high impedance. Thus, if the resistors R8 and R10 have a resistance of 1 kΩ, the voltage drops across the resistors R8 and R10 are about 1 mV. In this way, even if wiring resistances are taken into consideration, voltage drops across external impedance are kept smaller on the side of the voltage detection terminals U1 and U2. This helps eliminate the influence of the comparators that may degrade voltage detection accuracy, and thus it is possible to increase voltage detection accuracy.

Between the terminals U2 and GND, resistors R3 and R4 are connected in series. The voltage at the node between the resistors R3 and R4 is fed to the non-inverting input terminal (+) of a comparator 5. To the inverting input terminal (−) of the comparator 5, a voltage higher than the ground level by a reference voltage V2 is fed.

The resistances of the resistors R1 and R3 are equal, and the resistances of the resistors R2 ad R4 are equal. The reference voltages V1 and V2 are equal. Thus, the voltages of the cells 2 and 3 are checked against the same overdischarge voltage. The outputs of the comparators 4 and 5 are fed to an AND circuit 6. Thus, when the voltages of both of the cells 2 and 3 are higher than the overdischarge voltage, the AND circuit 6 outputs a high level that is used as a discharge enable signal SD.

When the discharge enable signal SD is fed to a discharge control circuit 7, the discharge control circuit 7 applies a voltage to the gate of the MOSFET 8, which is connected to the terminal T1, to turn on the MOSFET 8. By contrast, when the voltage of at least one of the cells 2 and 3 becomes lower than the overdischarge voltage, the discharge control circuit 7 turns off the MOSFET 8.

In this way, by providing the electric power supply terminals UC1 and UC2 and the voltage detection terminals U1 and U2 separately, it is possible to reduce the current flowing at the voltage detection terminals U1 and U2 to almost zero. This makes it possible to minimize the error in the detected electric power due to voltage drops across external impedance, such as the protection resistors R8 and R10 and wiring resistances, and thereby increase voltage detection accuracy.

When, for example, the resistor R10 is disconnected from the intermediate terminal U2 because of improper soldering or the like, the ground level is fed to the non-inverting input terminal (+) of the comparator 5. Thus, the comparator 5 behaves as if the voltage of the cell 3 were 0 V, and therefore outputs a low level. Accordingly, the AND circuit 6 stops outputting the discharge enable signal SD. As a result, the MOSFET 8 is turned off, and thus the discharging of the cells 2 and 3 is inhibited. The result of comparison by the comparator 4 is not affected.

Similarly, when the resistor R9 is disconnected from the electric power supply terminal UC2, no electric power is supplied to the comparator 5. Thus, the comparator 5 stops operating. Accordingly, the AND circuit 6 does not output the discharge enable signal SD. As a result, the MOSFET 8 is turned off, and thus the discharging of the cells 2 and 3 is inhibited. In this way, even if a disconnection occurs at the intermediate terminal UC2 or U2, it is possible to make a correct judgment and thereby prevent the cells 2 and 3 from being brought into an overdischarged state, with their characteristics degraded. This makes it possible to securely protect the cells.

The terminals UC1 and U1 may be provided as a single terminal. In that case, the resistors Ri and R2 are connected in series between this terminal and the terminal UC2, and electric power is supplied to the comparator 4 via this terminal. Even in this case, when a disconnection occurs at the intermediate terminal UC2 or U2, the MOSFET 8 is turned off in the same manner as described above. The MOSFET 8 may be replaced with a switching device of any other type. The overdischarge voltage does not necessarily have to be 2.2 V, but may be set at any other voltage.

<Second Embodiment>

Figure 2:
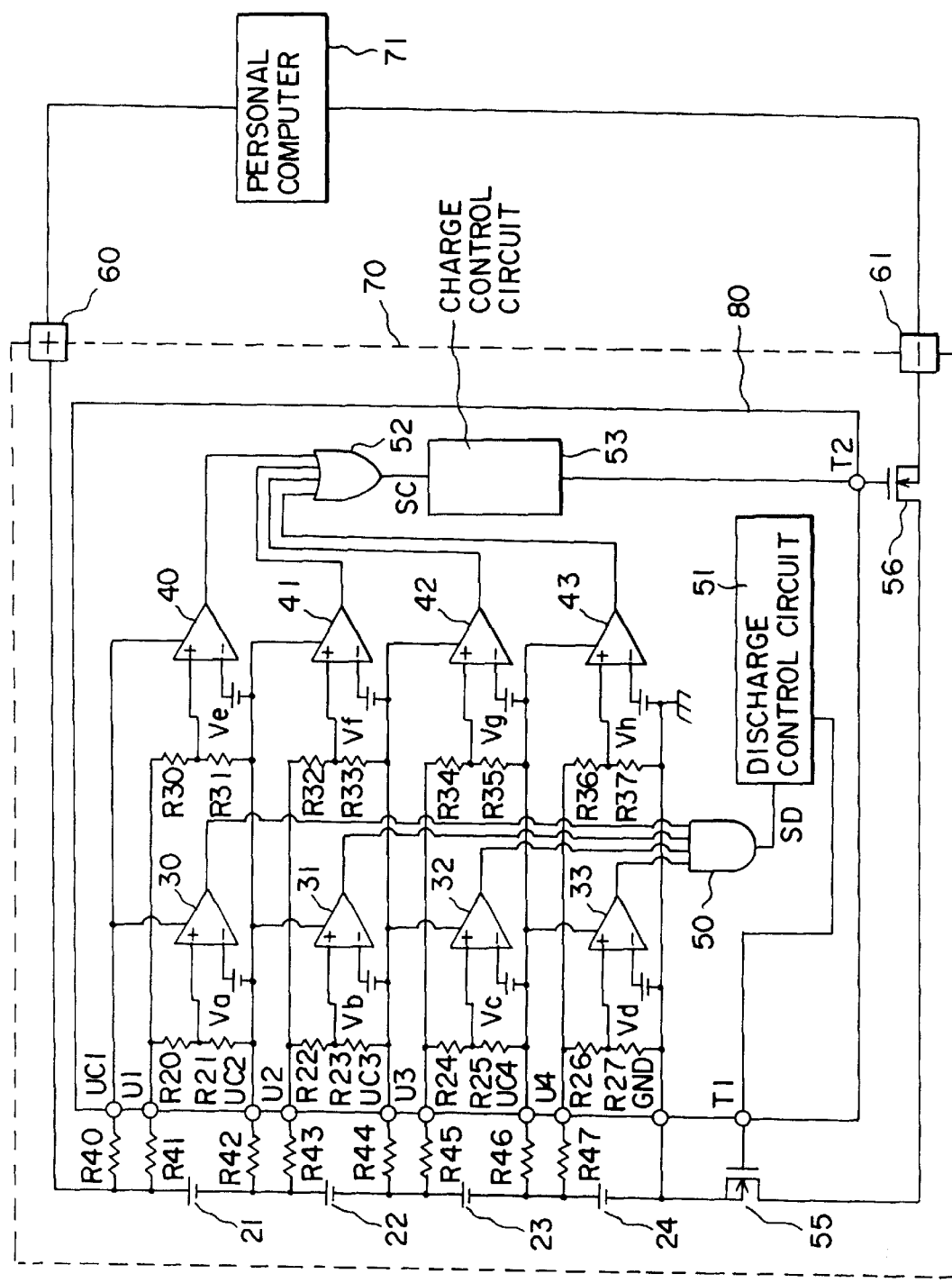
FIG. 2 is a block diagram of the power supply monitoring IC of a second embodiment of the present invention.

A second embodiment of the present invention will be described with reference to FIG. 2. FIG. 2 is a block diagram of a battery pack 70 employing a power supply monitoring IC 80 that monitors overdischarging and overcharging. The power supply monitoring IC 80 monitors four lithium-ion cells 21 to 24 to prevent them from being brought into an overdischarged or overcharged state.

The cells 21 to 24 are connected in series in this order from the highest potential end. The higher potential end of the cell 21 is connected to a positive terminal 60 of the battery pack 70, and the lower potential end of the cell 24 is connected to the drain of an n-channel MOSFET 55 provided for discharge control. The source of the MOSFET 55 is connected to the drain of an n-channel MOSFET 56 provided for charge control. The gate of the MOSFET 55 is connected to a terminal T1 of the power supply monitoring IC 80.

The source of the MOSFET 56 is connected to a negative terminal 61, the gate of the MOSFET 56 is connected to a terminal T2 of the power supply monitoring IC 80. As will be described later, the MOSFETs 55 and 56 are turned on and off by the power supply monitoring IC 80. During discharging, electric power is supplied to a personal computer 71 that is connected to terminals 60 and 61.

An electric power supply terminal UC1 is connected through a protection resistor R40 to the higher potential end of the cell. A voltage detection terminal U1 is connected through a protection resistor R41 to the higher potential end of the cell 21. Intermediate terminals are provided as follows. An electric power supply terminal UC2 is connected through a protection resistor R42 to the node between cells 21 and 22. A voltage detection terminal U2 is connected through a protection resistor R43 to the node between the cells 21 and 22.

An electric power supply terminal UC3 is connected through a protection resistor R44 to the node between the cells 22 and 23. A voltage detection terminal U3 is connected through a protection resistor R45 to the node between the cells 22 and 23. An electric power supply terminal UC4 is connected through a protection resistor R46 to the node between the cells 23 and 24. A voltage detection terminal U4 is connected through a protection resistor R47 to the node between the cells 23 and 24. The protection resistors R40 to R47 have a resistance of, for example, 1 kΩ.

Via the electric power supply terminals UC1 to UC4, electric power is supplied to comparators 30 to 33, and to comparators 40 to 43, respectively. Between the terminals U1 and UC2, resistors R20 and R21 are connected in series. The voltage at the node between the resistors R20 and R21 is fed to the non-inverting input terminal (+) of the comparator 30. To the inverting input terminal (−) of the comparator 30, a voltage higher than the voltage at the electric power supply terminal UC2 by a reference voltage Va is fed.

Similarly, between the voltage detection terminal U2 and the electric power supply terminal UC3, resistors R22 and R23 are connected in series. The voltage at the node between the resistors R22 and R23 is fed to the non-inverting input terminal (+) of the comparator 31. To the inverting input terminal (−) of the comparator 31, a voltage higher than the voltage at the electric power supply terminal UC3 by a reference voltage Vb is fed.

Similarly, between the terminals U3 and UC4, resistors R24 and R25 are connected in series. The voltage at the node between the resistors R24 and R25 is fed to the non-inverting input terminal (+) of the comparator 32. To the inverting input terminal (−) of the comparator 32, a voltage higher than the voltage at the electric power supply terminal UC4 by a reference voltage Vc is fed.

Similarly, between the terminals U4 and GND, resistors R26 and R27 are connected in series. The voltage at the node between the resistors R26 and R27 is fed to the non-inverting input terminal (+) of the comparator 33. To the inverting input terminal (−) of the comparator 33, a voltage higher than the ground level by a reference voltage Vd is fed.

The resistances of the resistors R20, R22, R24, and R26 are equal, for example 3 MΩ. The resistances of the resistors R21, R23, R25, and R27 are equal, for example 1 MΩ. The reference voltages Va to Vd are equal. The comparators 30 to 33 compare the voltages of the individual cells 21 to 24 with an overdischarge voltage. The overdischarge voltage is set, for example, at 2.2 V.

The outputs of the comparators 30 to 33 are fed to an AND circuit 50. Thus, when the voltages of all of the cells 21 to 24 are higher than the overdischarge voltage, the AND circuit 50 outputs a discharge enable signal SD. The output of the AND circuit 50 is fed to a discharge control circuit 51. When the discharge enable signal SD is fed to the discharge control circuit 51, the discharge control circuit 51 applies a voltage to the gate of the MOSFET 55, which is connected to the terminal T1, to turn on the MOSFET 55.

By contrast, when the voltage of at least one of the cells 21 to 24 becomes lower than the overdischarge voltage, the AND circuit 50 stops outputting the discharge enable signal SD. Thus, the discharge control circuit 51 turns off the MOSFET 55. In this way, during discharging, the power supply monitoring IC 80 monitors the cells 21 to 24 to prevent them from being brought into an overdischarged state.

On the other hand, during charging, the power supply monitoring IC 80 monitors the cells 21 to 24 to prevent them from being brought into an overcharged state. Between the terminals U1 and UC, resistors R30 and R31 are connected in series. The voltage at the node between the resistors R30 and R31 is fed to the non-inverting input terminal (+) of the comparator 40. To the inverting input terminal (−) of the comparator 40, a voltage higher than the voltage at the terminal UC2 by a reference voltage Ve is fed. Thus, the comparator 40 outputs a high level when the voltage of the cell 21 is higher than a predetermined overcharge voltage, and outputs a low level when the voltage of the cell 21 is lower than the overcharge voltage. The overcharge voltage is set, for example, at 4.3 V.

Similarly, between the terminal U2 and UC3, resistors R32 and R33 are connected in series. The voltage at the node between the resistors R32 and R33 is fed to the non-inverting input terminal (+) of the comparator 41. To the inverting input terminal (−) of the comparator 41, a voltage higher than the voltage at the terminal UC3 by a reference voltage Vf is fed.

Similarly, between the terminals U3 and UC4, resistors R34 and R35 are connected in series. The voltage at the node between the resistors R34 and R35 is fed to the non-inverting input terminal (+) of the comparator 42. To the inverting input terminal (−) of the comparator 42, a voltage higher than the voltage at the terminal UC4 by a reference voltage Vg is fed.

Similarly, between the terminals U4 and GND, resistors R36 and R37 are connected in series. The voltage at the node between the resistors R36 and R37 is fed to the non-inverting input terminal (+) of the comparator 43. To the inverting input terminal (−) of the comparator 43, a voltage higher than the ground level by a reference voltage Vh is fed.

The outputs of the comparators 40 to 43 are fed to an OR circuit 52. Thus, when the voltage of at least one of the cells 21 to 24 is higher than the overcharge voltage, the OR circuit 52 outputs a high level. By contrast, when the voltages of all of the cells 21 to 24 are lower than the overcharge voltage, the OR circuit 52 outputs a low level. In this way, the OR circuit 52 outputs a charge inhibition signal SC. The output of the OR circuit 52 is fed to a charge control circuit 53.

When the charge control circuit 53 is not receiving a high level as the charge inhibition signal SC, it applies a voltage to the gate of the MOSFET 56, which is connected to the terminal T2, to turn on the MOSFET 56. By contrast, when the charge control circuit 53 receives a low level as the charge inhibition signal SC, it turns off the MOSFET 56. In this way, while the cells 21 to 24 are being charged via the terminals 60 and 61, the voltages of the individual cells 21 to 24 are monitored to check whether they are higher than the overcharge voltage or not so that, if the voltage of any of the cells 21 to 24 is higher than the overcharge voltage, the MOSFET 56 is turned off to inhibit charging.

By the use of the power supply monitoring IC 80 of this embodiment, it is possible to monitor four lithium-ion cells 21 to 24 connected in series to prevent them from being brought into an overdischarged or overcharged state. Since the resistors R20 to R27 ensure a high impedance, almost no current flows at the voltage detection terminals U1 to U4. This helps minimize the voltage drops across the protection resistors R41, R43, R45, and R45 and across wiring resistances, and thereby minimize detection errors.

Moreover, for the same reasons as given previously in the descriptions of the first embodiment, even if a disconnection occurs because of improper soldering at the intermediate terminals U2 to U4 and UC2 to UC4, the disconnection does not cause a wrong judgment. Thus, even in such a case, the power supply monitoring IC 80 turns off the MOSFET 55 and thereby prevents the cells 21 to 24 from being brought into an overdischarged state. Similarly, the comparators 40 to 43 for detecting an overcharge voltage do not make a wrong judgment.

When the lithium-ion cells 21 to 24 are subjected to overcurrent, there is a risk of smoking or the like. For this reason, it is also possible to provide the power supply monitoring IC 80 with a function for preventing overcurrent. For example, by exploiting the on-state resistance of the MOSFET 55 or the like, the current flowing therethrough is converted into a voltage so that, when the detected voltage indicates overcurrent, the MOSFET 55 is turned off.

As shown in FIG. 2, the power supply monitoring IC 80 employs the same circuit configuration for each of the cells 21 to 24, and therefore can be designed to monitor any number, like 2, 3, . . . , of cells. For example, a power supply monitoring IC designed to monitor two or three cells can be used in a portable telephone, portable video recorder, or the like; a power supply monitoring IC designed to monitor three or four cells can be used, as shown in FIG. 2, in a personal computer 71, or the like. The battery pack 70 of this embodiment can be used not only in a personal computer 71, but also in an appliance of any other kind.

The MOSFETs 55 and 56 may be inserted anywhere as long as they can, when turned off, inhibit the discharging or charging of the cells 21 to 24. As described previously, the terminals UC1 and U1 may be provided as a single terminal.

INDUSTRIAL APPLICABILITY

As described above, the present invention makes it possible to monitor the voltages of secondary cells accurately for the prevention of overdischarging and overcharging, and is thus very suitable for a battery pack employing lithium-ion cells, which pose a risk of smoking or the like when brought into an overdischarged or overcharged state.

What is claimed is:

1. A power supply monitoring integrated circuit device for individually monitoring voltages of a plurality of cells connected in series to control charging or discharging operation of the cells, comprising:

a plurality of pairs of input terminals provided one pair for each of the cells and each pair independently of the other pairs for receiving the voltages of the cells, each pair of input terminals including a first input terminal connected to a positive end of a particular cell and a second input terminal connected to a negative end of that particular cell;

a plurality of voltage dividing means for dividing the voltages of the cells received via the first and second input terminals;

a plurality of comparators for comparing output voltages of the voltage dividing means with a predetermined voltage;

a plurality of electric power input terminals for receiving electric power fed through a resistor from a higher potential end of the cells to operate the comparators individually;

a control means connected to the comparators so as to generate a stop signal for stopping the charging or discharging operation when the voltage of at least one of the cells exceeds the predetermined voltage; and an output terminal connected to the control means for outputting the stop signal, wherein the electric power input terminals include an electric power input terminal for receiving electric power to be fed to the comparator corresponding to the cell located at a positive side end of the cells and the second input terminals shared also for receiving electric power to be fed to the comparators corresponding to the cells other than the cell located at the positive side end of the cells.

2. A power supply monitoring integrated circuit device as claimed in claim 1, wherein the cells are lithium-ion cells.

3. A power supply monitoring integrated circuit device as claimed in claim 1, wherein two of the comparators are provided for each of the cells, one comparator being used for overdischarge detection, the other comparator being used for overcharge detection, the two comparators using different reference voltages for comparison.

4. A power supply monitoring integrated circuit device as claimed in claim 3, wherein two of the voltage dividing means are provided for each of the cells, one voltage dividing means being connected to corresponding one of the comparators for overdischarge detection, the other voltage dividing means being connected to corresponding one of the comparators for overcharge detection.

5. A power supply monitoring integrated circuit device as claimed in claim 3, wherein each pair of the input terminals is connected to corresponding two of the comparators.

6. A power supply monitoring integrated circuit device for individually monitoring voltages of a plurality of cells connected in series to control charging or discharging operation of the cells, comprising:

a plurality of pairs of input terminals provided one pair for each of the cells for receiving the voltages of the cells, each pair of input terminals including a first input terminal connected to a positive end of a particular cell and a second input terminal connected to a negative end of that particular cell;

a plurality of voltage dividing means for dividing the voltages of the cells received via the first and second input terminals;

a plurality of comparators for comparing output voltages of the voltage dividing means with a predetermined voltage;

a plurality of electric power input terminals for receiving electric power fed through a resistor from a higher potential end of the cells to operate the comparators individually;

a control means connected to the comparators so as to generate a stop signal for stopping the charging or discharging operation when the voltage of at least one of the cells exceeds the predetermined voltage; and an output terminal connected to the control means for outputting the stop signal, wherein the electric power input terminals include an electric power input terminal for receiving electric power to be fed to the comparator corresponding to the cell located at a positive side end of the cells and the second input terminals shared also for receiving electric power to be fed to the comparators corresponding to the cells other than the cell located at the positive side end of the cells.

* * * * *